United States Patent [19]
Tseng

[11] Patent Number: 5,521,112
[45] Date of Patent: May 28, 1996

[54] METHOD OF MAKING CAPACITOR FOR STACK DRAM CELL

[75] Inventor: Horng-Huei Tseng, Hsin-chu, Taiwan

[73] Assignee: Industrial Technology Research Institute, Hsinchu, Taiwan

[21] Appl. No.: 318,424

[22] Filed: Oct. 5, 1994

[51] Int. Cl.$^6$ ............................................. H01L 21/8242
[52] U.S. Cl. ............................ 437/52; 437/60; 437/919
[58] Field of Search ................................. 437/52, 60, 919

[56] References Cited

U.S. PATENT DOCUMENTS

| | | | |
|---|---|---|---|
| 5,438,013 | 8/1995 | Kim et al. ................................. | 437/60 |
| 5,444,005 | 8/1995 | Kim et al. ................................. | 437/52 |

*Primary Examiner*—Mary Wilczewski
*Assistant Examiner*—Richard A. Booth
*Attorney, Agent, or Firm*—George O. Saile; Stephen B. Ackerman

[57] ABSTRACT

A method, and resultant structure, for fabricating a DRAM (Dynamic Random Access Memory) cell with a stack capacitor is described. AMOS (metal oxide semiconductor) device and adjacent word line are provided, having first and second active regions, in a silicon substrate. A first insulating layer is formed over the MOS device and word line, and patterned to form a cell contact opening to the first active region. A first conductive layer is formed over the first insulating layer and in the opening. A second insulating layer is formed over the first conductive layer, and patterned to form a second opening centered over the cell contact opening. Silicon nitride spacers are formed on the vertical surfaces of the second opening. The first conductive layer is oxidized within the second opening, forming an oxide mask. The silicon nitride spacers are removed. A third opening is formed in the first conductive layer, in areas not masked by the oxide mask. The oxide mask and the second insulating layer are removed. A photoresist mask is formed between, over, and adjacent to the third opening. The first conductive layer is patterned in areas not masked by the photoresist mask, thereby forming a bottom electrode for the stack capacitor. The capacitor is completed by forming a capacitor dielectric and top electrode.

20 Claims, 7 Drawing Sheets

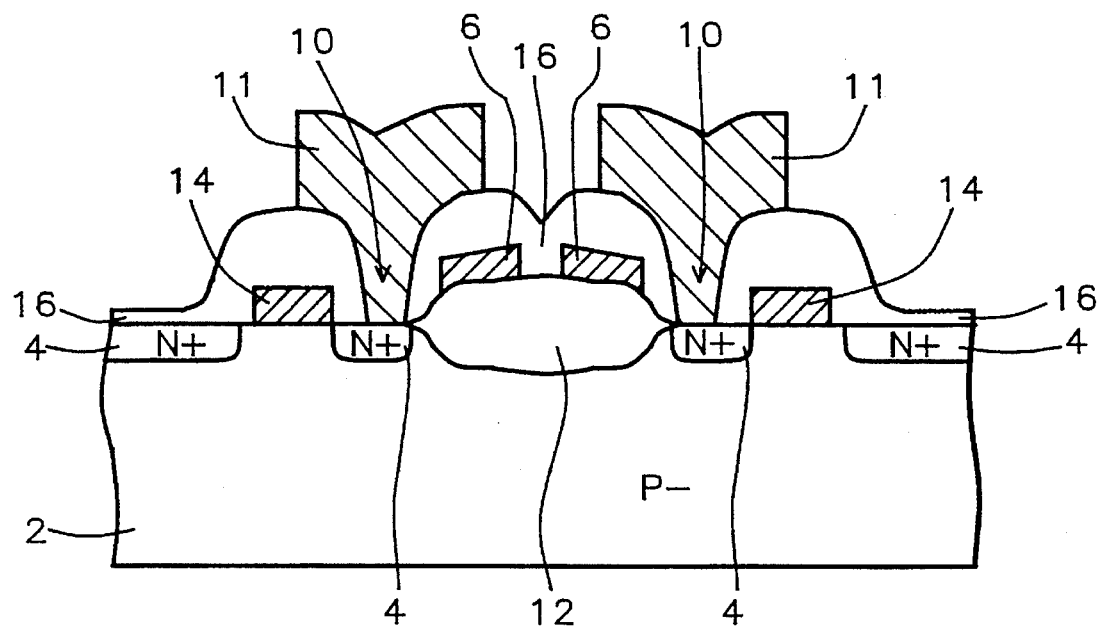
*FIG. 1 — Prior Art*
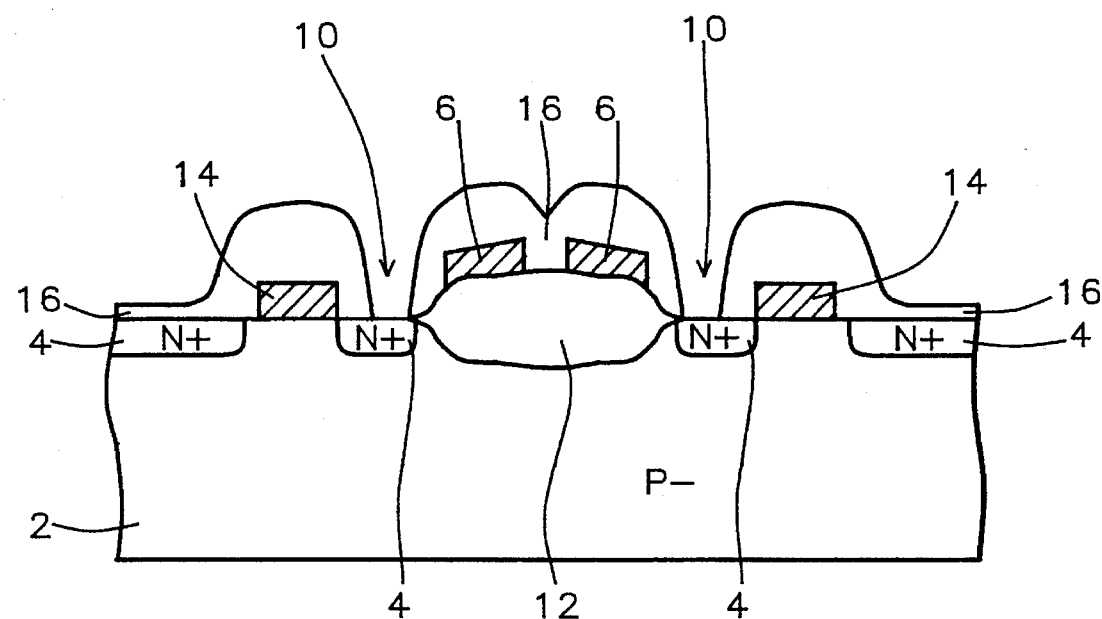
*FIG. 2*

5,521,112

1

METHOD OF MAKING CAPACITOR FOR STACK DRAM CELL

BACKGROUND OF THE INVENTION (1) Field of the Invention

This invention relates to a method of making, and the resultant structure for, a DRAM (Dynamic Random Access Memory) cell, and more particularly to a method of making, and the resultant structure of, a DRAM stack capacitor.

(2) Description of the Related Art

A typical DRAM cell consists of a single transistor and a storage capacitor. Digital information is stored in the capacitor and accessed through the transistor, by way of addressing the desired memory cell, which is connected with other such cells through an array of bit lines and word lines. In order to construct high density DRAMs in a reasonably sized chip area, both the transistor and capacitor elements must occupy less lateral space in each memory cell than in the previous generation DRAM designs. As DRAMs are scaled down in dimensions, there is a continuous challenge to maintain a sufficiently high stored charge per capacitor unit area. Efforts to increase capacitance without increasing the planar area of the capacitor have been concentrated on building three dimensional capacitor structures, which increase the capacitor surface area. Thus cell structures have had to change from the conventional planar-type capacitors to either trench capacitors or stack capacitors, in particular at densities above 4 Mbit.

When the stack capacitor approach is used, in order to maintain sufficient capacitance the storage node must have a large surface area, and consequently must be formed significantly above the surface of the substrate in which the DRAM cell is formed, thus leading to topological problems in the formation of subsequent layers.

In the prior art DRAM cell of FIG. 1, an FET (Field Effect Transistor) is shown on each side of field oxide 12, on silicon substrate 2, and consists of gate electrode 14 and active regions 4. Word lines 6 are formed to connect memory cells together, and are commonly formed on field oxide 12. An insulating layer 16 is deposited and patterned to form cell contacts 10 to provide the capacitor to FET contact. The bottom electrode 11 of the capacitor is shown, and the capacitor would be completed by adding a dielectric and top electrode to the FIG. 1 structure. In order to provide the large surface area needed, or to increase the capacitance, the capacitor must be formed at a significant height above the substrate.

SUMMARY OF THE INVENTION

It is therefore an object of the invention to provide a method for fabricating a DRAM cell with a stack capacitor.

It is a further object of the invention to provide a DRAM cell structure with a stack capacitor.

These objects are achieved by a method of forming a stack capacitor for a DRAM cell in which a MOS (metal oxide semiconductor) device is provided, having first and second active regions, adjacent to a field oxide region on which there is a conductive word line, in a silicon substrate. A first insulating layer is formed over the MOS device, the conductive word line, and the field oxide region. The first insulating layer is patterned to form a cell contact opening to the first active region. A first conductive layer is formed over the first insulating layer and in the opening. A second insulating layer is formed over the first conductive layer. The

2 second insulating layer is patterned to form a second opening centered over the cell contact opening. Silicon nitride spacers are formed on the vertical surfaces of the second opening. The first conductive layer is oxidized within the second opening, whereby an oxide mask is formed. The silicon nitride spacers are removed. A third opening is formed in the first conductive layer, in areas not masked by the oxide mask. The oxide mask and the second insulating layer are removed. A photoresist mask is formed between, over, and adjacent to the third opening. The first conductive layer is patterned in areas not masked by the photoresist mask, whereby a bottom electrode for the stack capacitor is formed. A capacitor dielectric is formed over the bottom electrode. A top electrode is formed over the capacitor dielectric.

These objects are further achieved by a DRAM stack capacitor, connected to an FET (field effect transistor) with first and second active regions. A bottom electrode is connected to and extends up from the first active region of the FET, with a top surface having a trench near its periphery. A capacitor dielectric is formed over the bottom electrode. A top electrode is formed over the capacitor dielectric.

BRIEF DESCRIPTION OF THE DRAWINGS

FIG. 1 is a cross-sectional representation of a prior art stack capacitor structure.

FIGS. 2 to 11, and 13 are a cross-sectional representation of the method of the invention, and the resultant structure, for a DRAM cell with a stack capacitor.

DESCRIPTION OF THE PREFERRED EMBODIMENTS

Figure 3:
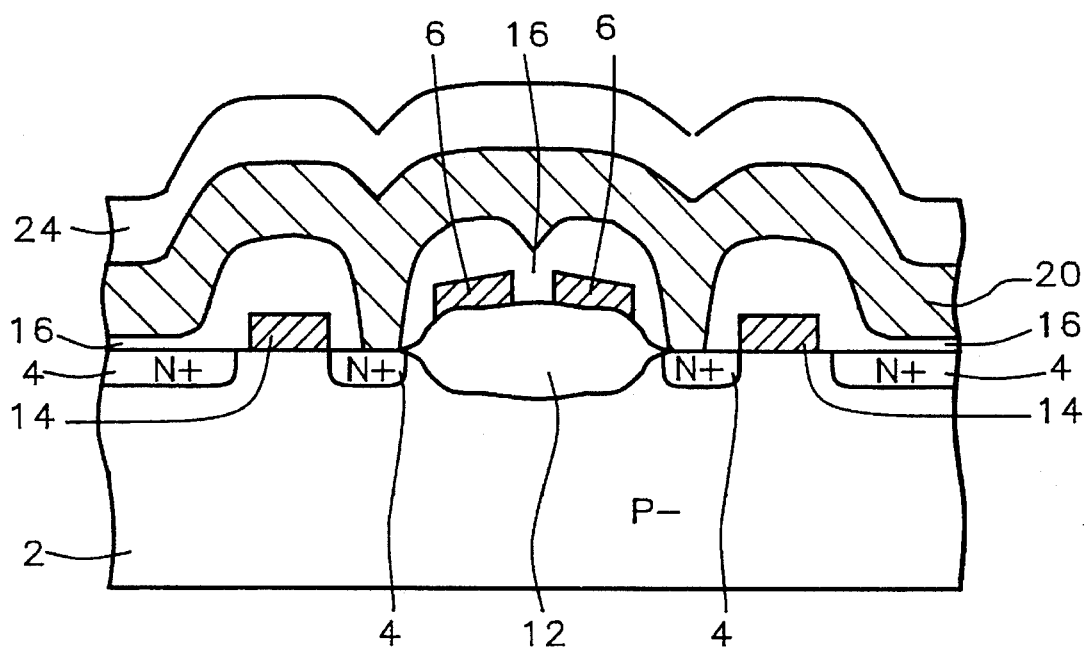

A method for fabricating the DRAM stack capacitor of the invention will now be described with reference to FIGS. 2 to 14. As shown in FIG. 2, a base substrate 2 of, for example, P- monocrystalline silicon, is provided. Field oxide (FOX) isolation region 12 is formed and serves to isolate semiconductor surface regions from other such regions in the silicon substrate, for example the two DRAM cells shown in FIG. 2 and subsequent drawings. In an effort to simplify the description and the drawings, the formation of the field oxide isolation region will not be described in detail, because it is conventional. One method of forming these regions is described by E. Kooi in U.S. Pat. No. 3,970,486, wherein selected surface portions of a silicon substrate are masked against oxidation, and the exposed unmasked surface is oxidized to grow a thermal oxide which in effect sinks into the silicon surface at the unmasked areas. The mask is removed, and semiconductor devices can then be formed in the openings between the isolation regions.

The formation of the field effect transistor, and the word line 6, both shown in FIG. 2, will now be described. A layer of polysilicon is deposited over the substrate and FOX 12, by LPCVD (Low Pressure Chemical Vapor Deposition) to a thickness of between about 1500 and 3000 Angstroms. This layer is doped by ion implanting with phosphorous or arsenic ions at a dosage of between about 5 E 15 and 2 E 16 atoms/cm.$^2$ and an energy of between about 20 and 60 Kev., or may be doped in situ by the addition of dopant gases such as phosphine during deposition. Alternately, doping could be accomplished by diffusion using phosphorus oxychloride (POCl$_3$) at a temperature of between about 875° and 900° C., for between about 30 and 50 minutes.

The doped polysilicon is then patterned by conventional lithography and etching to form the gate 14 and wordline 6. Active regions 4 are then formed by ion implanting an N+ dopant such as phosphorus P31 or arsenic AS75 at a concentration of between about 2 E 15 and 1 E 16 atoms/cm.$^2$ and at an energy of between about 20 and 70 KeV. it is well understood by those skilled in the art that opposite dopants may be used, i.e., the substrate could be doped N– and the active regions made P+, without changing the scope of the invention.

A layer of silicon oxide 16 is formed, by LPCVD, to a thickness of between about 500 and 2000 Angstroms. An opening is then formed in the oxide 16, over the active region 4 between the gate electrode 14 and FOX 12. This will be the location for the formation of the stacked capacitor of the invention, and the opening provides for a contact to the underlying active region 4. The contact opening 10 is formed by reactive ion etching with Ar (argon) at 350 sccm (standard cubic centimeters per minute), CF$_4$ (carbon tetrafluoride) at 20 sccm, and CHF$_3$ (trifluoromethane) at 20 sccm, at a pressure of about 250 mtorr, and a power of about 1250 watts. A Rainbow 4520, manufactured by Lam Research Company, may be used for this etch.

Figure 4:
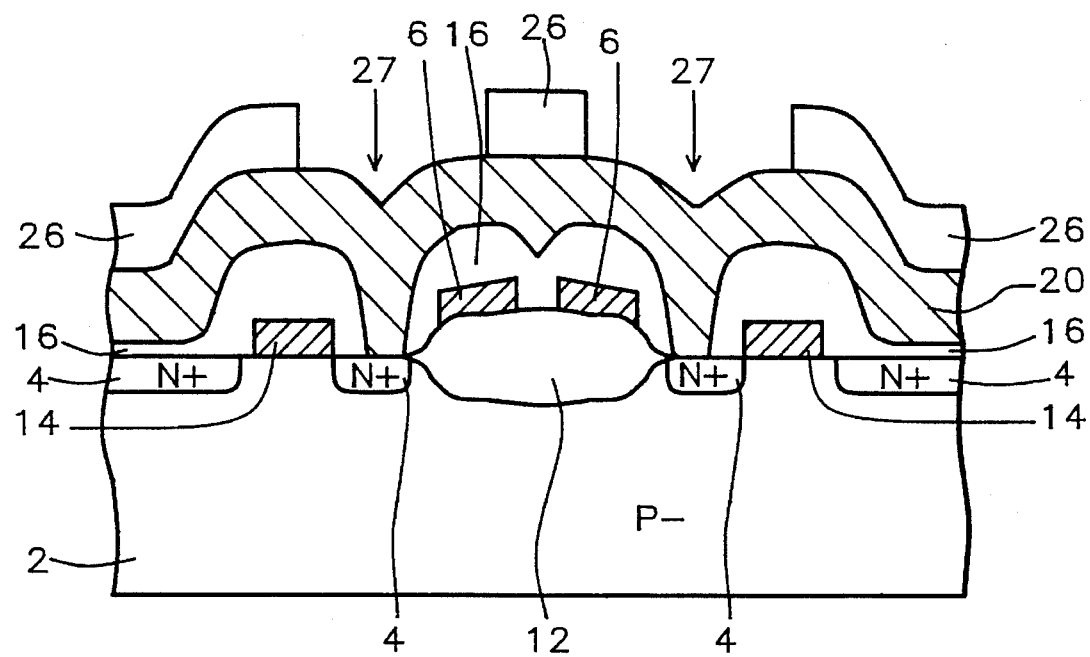

Referring now to FIG. 3, a layer 20 of doped polysilicon is deposited to a thickness of between about 2000 and 6000 Angstroms. This layer is deposited and doped in the same manner as the first poly layer from which the gate 14 and word line 6 were formed, described above. Subsequently, a silicon oxide (SiO$_2$) layer 24 is conformally deposited by CVD to a thickness of between about 1500 and 4000 Angstroms. With reference to FIG. 4, the oxide 24 is patterned by conventional lithography and etching in the manner shown to to result in patterned layer 26 and openings 27, which are formed at the location of the capacitor to be formed, and are approximately centered over the cell contact 10.

Figure 5:
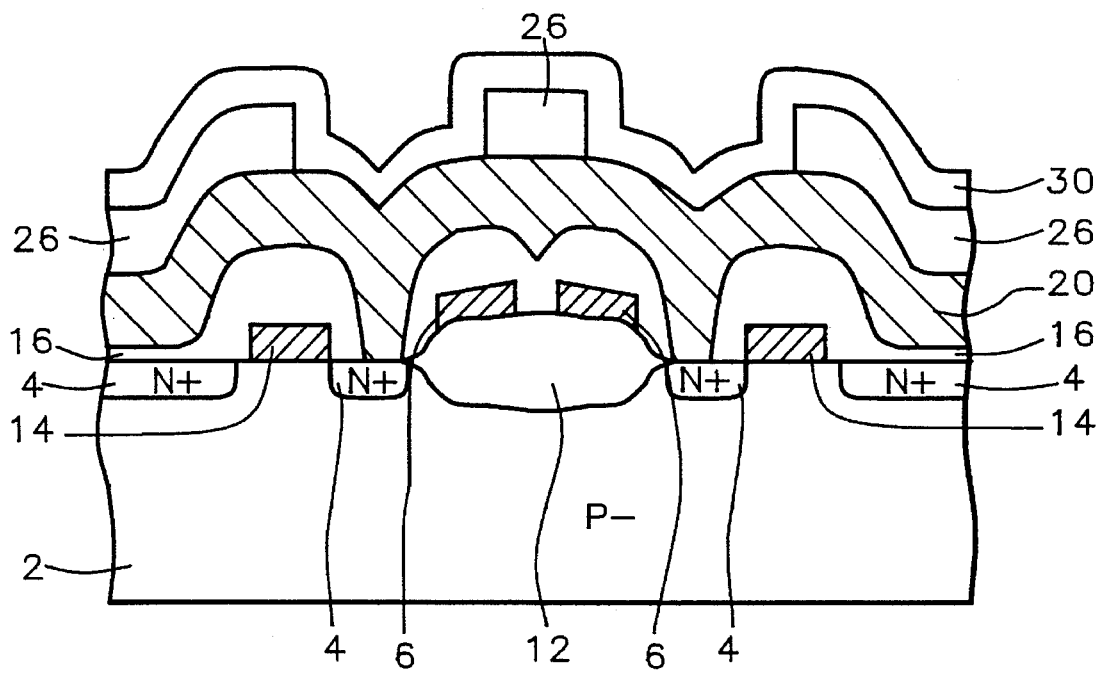
Figure 6:
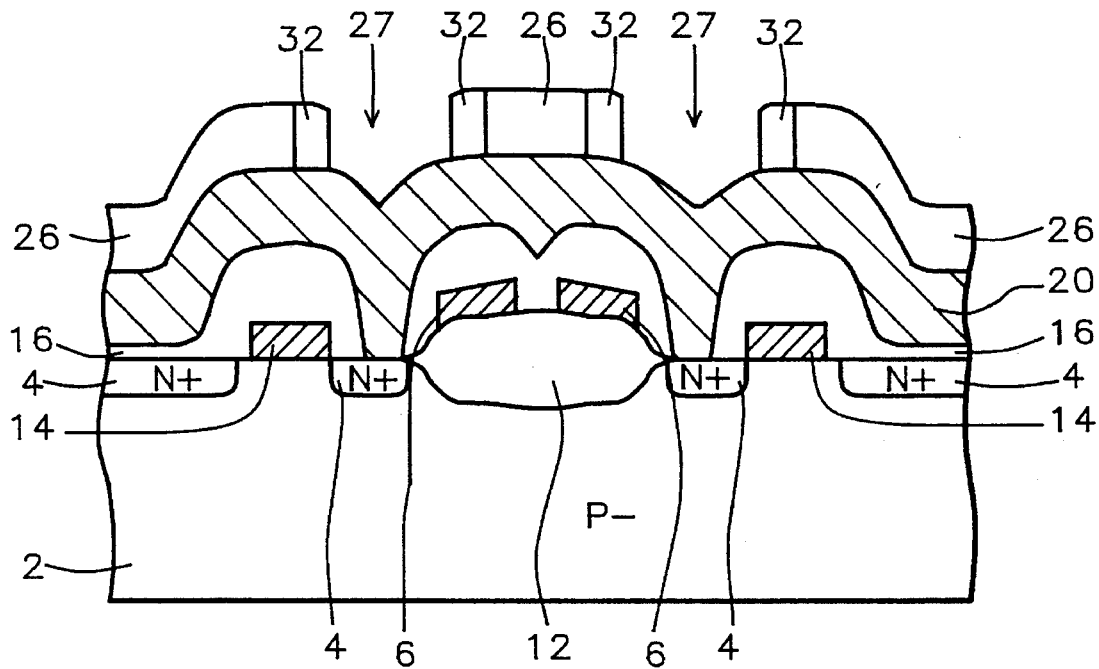

Referring now to FIGS. 5 and 6, a layer of silicon nitride 30 (Si$_3$N$_4$) is deposited by LPCVD using NH$_3$ (ammonia), SiH$_4$ (silane) at a pressure of about 350 mtorr and a temperature of about 760° C., to a thickness of between about 600 and 2400 Angstroms. Anisotropic etching with a gas such as CF$_4$+O$_2$ (carbon tetrafluoride and oxygen) or CF$_4$+H$_2$ (carbon tetrafluoride and hydrogen) is used to form nitride spacers 32 on the sidewalls of openings 27. The thickness of these spacers can be adjusted by varying the deposition thickness of original nitride layer 30.

Figure 7:
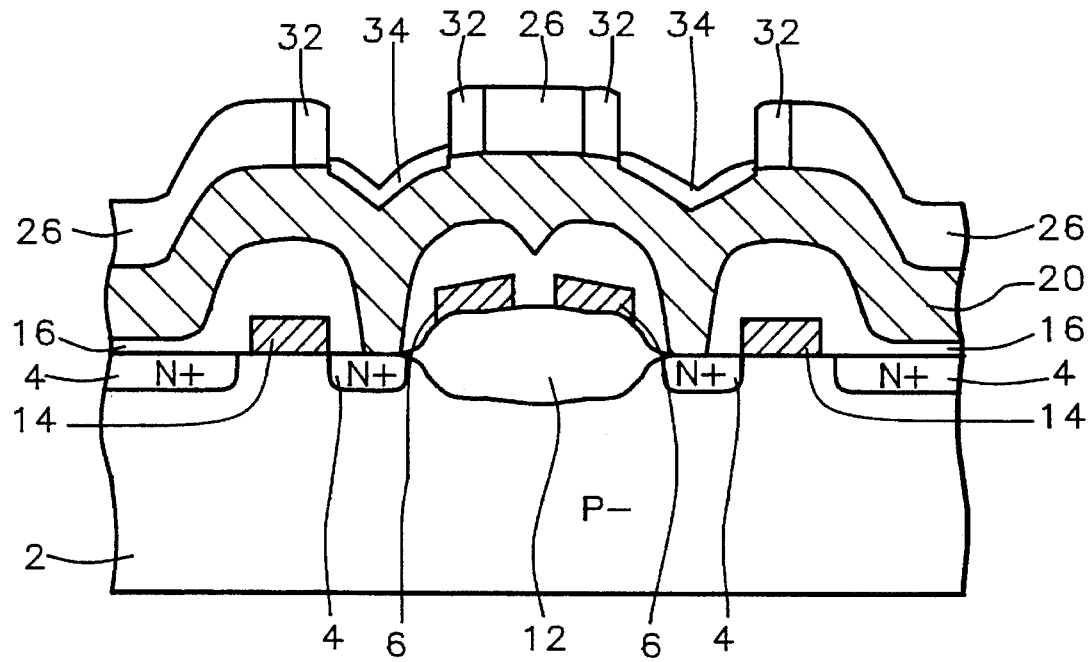

With reference to FIG. 7, thermal oxidation is performed to from an oxide mask 34 on the exposed surface of polysilicon layer 20. This oxidation would take place in an ambient of wet oxygen, at a temperature of between about 870° and 880° C., for between about 8 and 60 minutes, to form a mask 34 with a thickness of between about 200 and 800 Angstroms.

Figure 8:
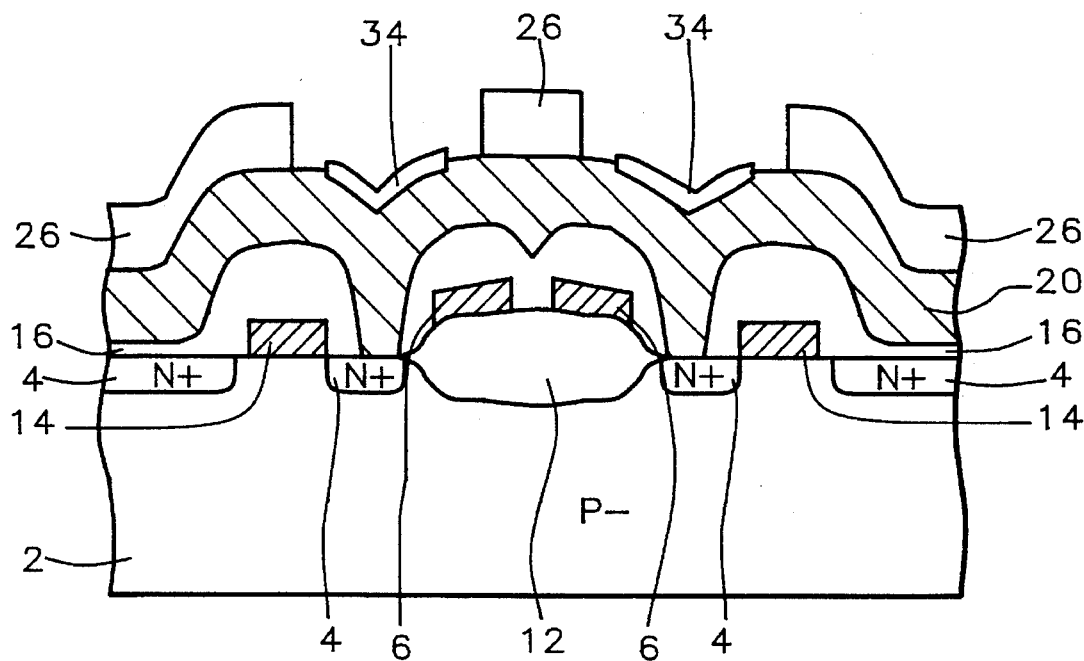

As shown in FIG. 8, nitride spacers 32 are removed by etching in phosphoric acid (H$_3$PO$_4$) at a temperature of between about 150° and 180° C. for between about 30 and 120 minutes.

Figure 9:
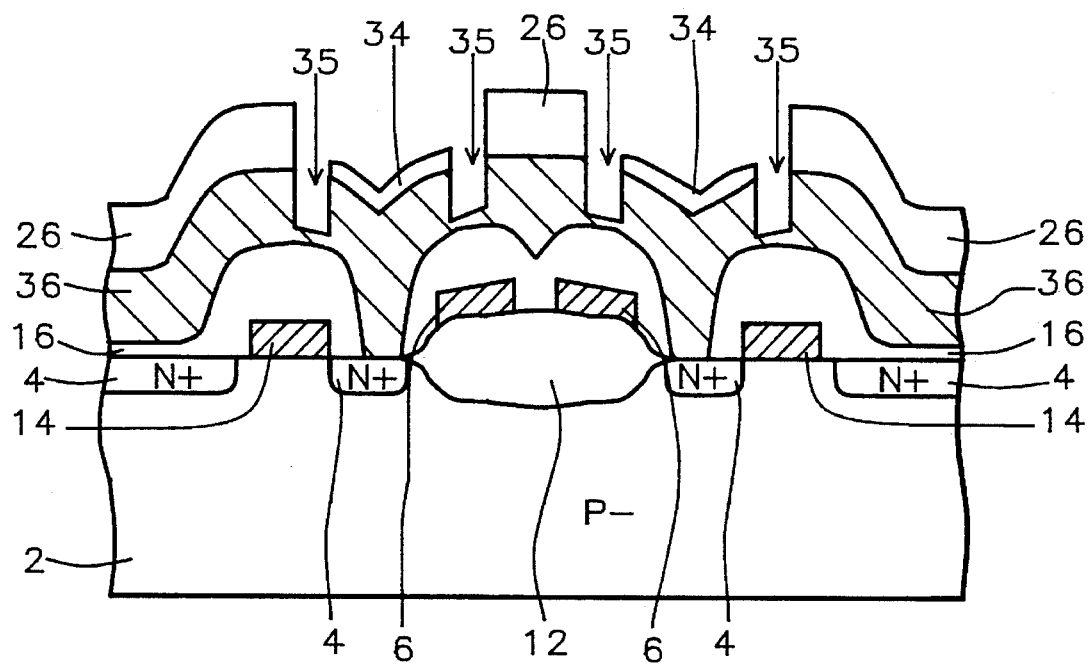

In a critical step of the invention, as shown in FIG. 9, a trench 35 is formed in patterned polysilicon 36 by reactive ion etching. This trench provides additional surface area for the capacitor of the invention to increase the capacitance without a large increase in its height above the substrate 2.

This reactive ion etch is performed using He (helium) at 180 sccm, Cl$_2$ (chlorine) at 420 sccm and HBr (hydrogen bromide) at 80 sccm, at a pressure of about 525 mtorr, and a power of about 450 watts. The resultant etch rate is about 3800 Angstroms/minute. A Rainbow 4400, manufactured by Lam Research Company, may be used for this etch. The resultant trench depth is between about 1000 and 5000 Angstroms. The width of the trench may be modified by altering the width of the removed nitride spacers, which as noted earlier can be accomplished by varying the original nitride deposition thickness.

Figure 10:
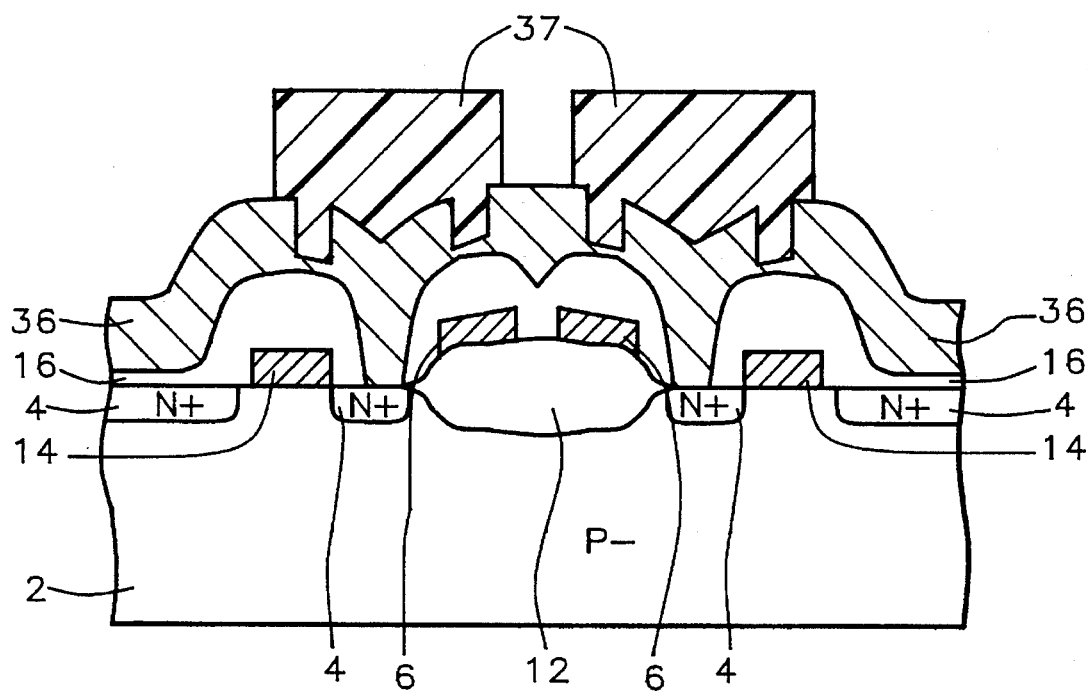
Figure 11:
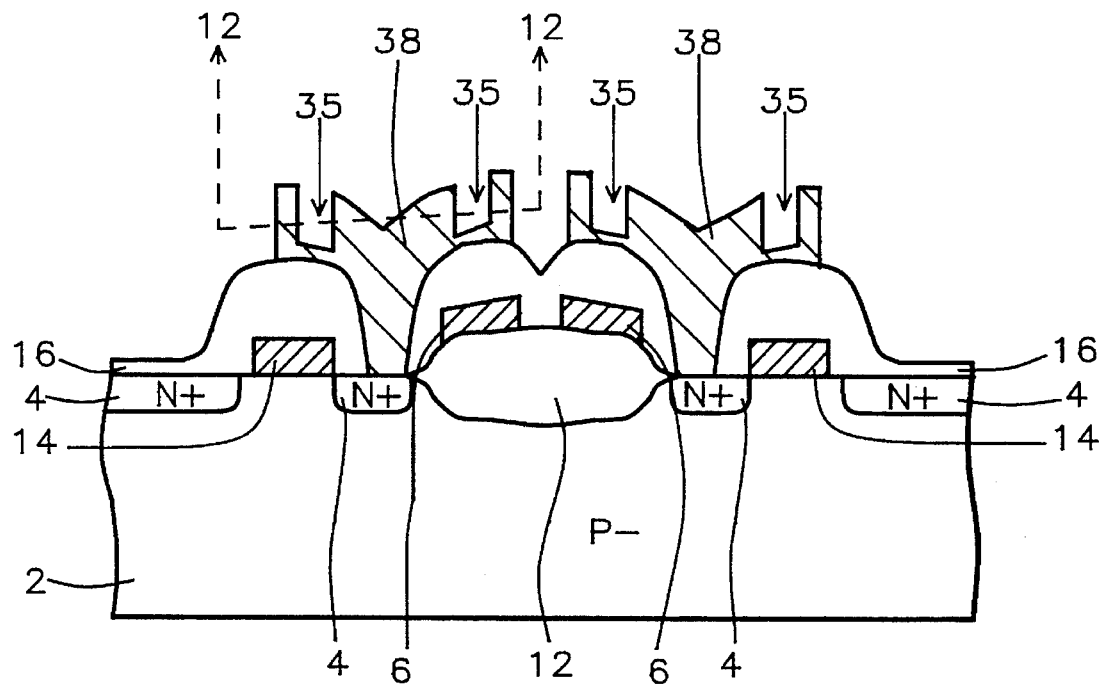
Figure 12:
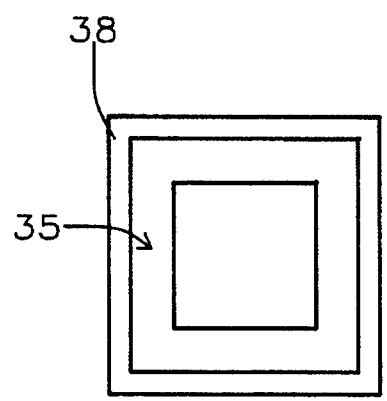
FIG. 12 is a top view of the bottom electrode of the stack capacitor of the invention, taken along line 12—12 of FIG. 11.

Referring now to FIGS. 10 and 11, the capacitor bottom electrode 38 is completed. A photoresist mask 37 is formed by conventional lithography over polysilicon 36, where the mask covers the capacitor trench, the area within the trench, and a small region of the poly 36 adjacent to the trench. Etching of doped poly 36 is performed, using mask 37 and the same etch as noted above for etching the trench 35. The resultant bottom capacitor electrode 38 is shown in FIG. 11, and a top view of is shown in FIG. 12, which is taken along line 12—12 of FIG. 11.

Figure 13:
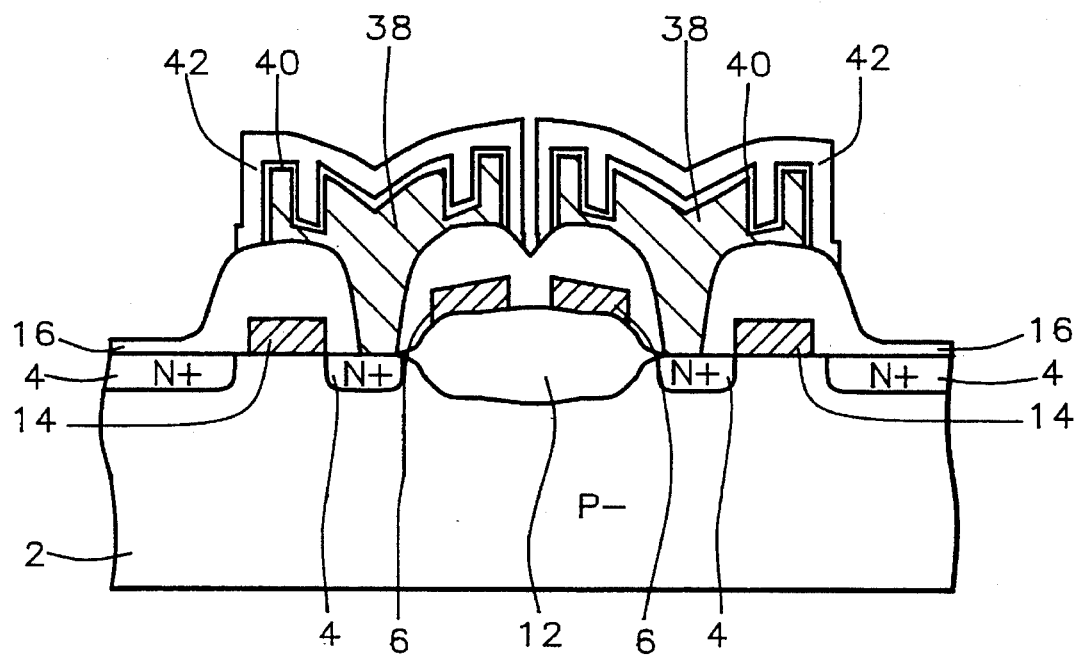

Referring now to FIG. 13, a capacitor dielectric 40 is formed over the surface of the bottom electrode 38. There are several materials that are suitable for the dielectric, such as ON (oxide-nitride), ONO (oxide-nitride-oxide), or Ta$_2$O$_5$ (tantalum oxide). The preferred dielectric is formed of ONO to a thickness of between about 30 and 90 Angstroms. The bottom oxide is formed by exposure in DI (deionized) water to form an oxide with a thickness of between about 20 and 40 Angstroms. The middle nitride is formed by LPCVD at a temperature of about 760° C., a pressure of 350 mtorr, in NH$_3$ (ammonia) and SiH$_4$ (silane), to a thickness of between about 20 and 50 Angstroms. The top oxide is formed by oxidation in a dry oxygen ambient, at a temperature of about 850° C. for about 30 minutes.

The top electrode 42 of the stack capacitor of the invention is now formed, by forming a layer of doped polysilicon, in the same manner as described earlier for the other layers of polysilicon, to a thickness of between about 1000 and 3000 Angstroms.

The capacitor is completed by anisotropic etching of the dielectric and top electrode layers, to result in the final structure of FIG. 13, which includes bottom electrode 38, capacitor dielectric 40 and top electrode 42.

Figure 14:
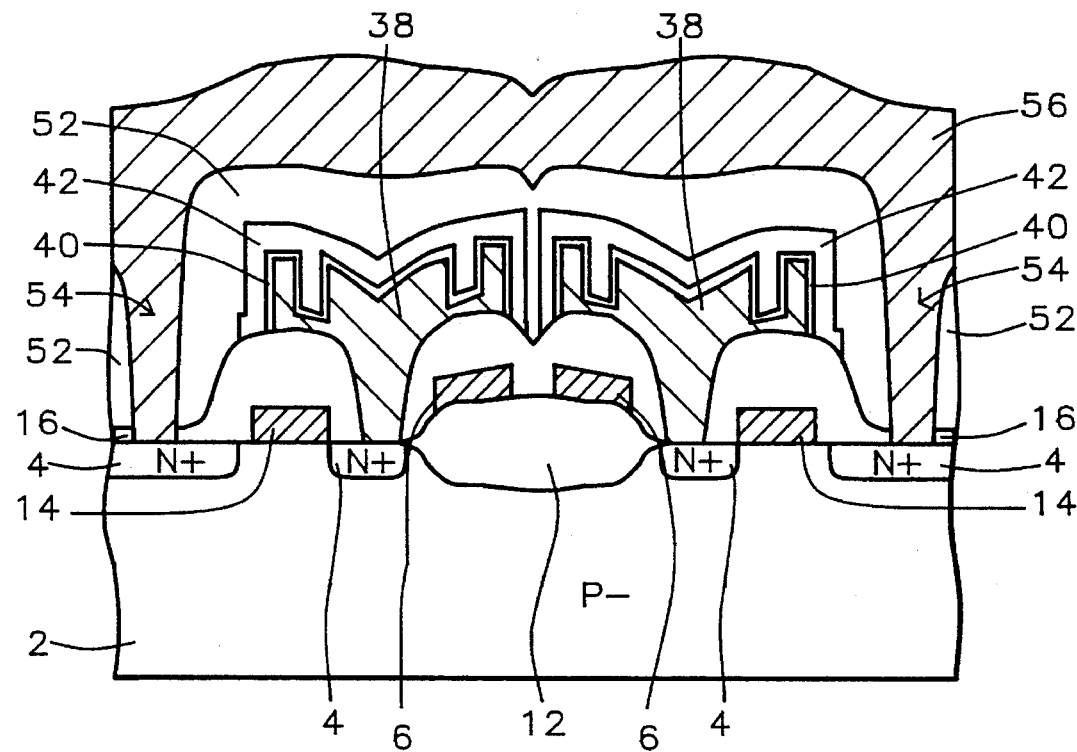
FIG. 14 is a cross-sectional representation of the resultant structure of the invention, of a DRAM cell with a stack capacitor, including a bit line contact.

As shown in FIG. 14, completion of the DRAM takes place, by depositing a thick insulating layer of borophosphosilicate glass (BPSG) 52 to a thickness of between about 3000 and 8000 Angstroms, and forming bit line node contact 54 from metallization layer 56, through the BPSG 52 and oxide 16 to acive region 4.

While the invention has been particularly shown and described with reference to the preferred embodiments thereof, it will be understood by those skilled in the art that various changes in form and details may be made without departing from the spirit and scope of the invention. For instance, while formation of an N-channel transistor was described prior to formation of the stacked capacitor of the invention, a P-channel transistor could have been similarly formed as part of the DRAM cell.

What is claimed is:

1. A method of forming a stack capacitor for a DRAM (Dynamic Random Access Memory) cell, comprising the steps of:

providing a MOS (metal oxide semiconductor) device having first and second active regions, adjacent to a field oxide region on which there is a conductive word line, in a silicon substrate;

forming a first insulating layer over said MOS device, said conductive word line, and said field oxide region;

patterning said first insulating layer to form a cell contact opening to said first active region;

forming a first conductive layer over said first insulating layer and in said opening;

forming a second insulating layer over said first conductive layer;

patterning said second insulating layer to form a second opening centered over said cell contact opening, said second opening having vertical surfaces and a portion of said first conductive layer therein;

forming silicon nitride spacers on the vertical surfaces of said second opening;

oxidizing said first conductive layer within said second opening, whereby an oxide mask is formed;

removing said silicon nitride spacers;

forming a third opening in said first conductive layer, in areas not masked by said oxide mask;

removing said oxide mask and said second insulating layer;

forming a photoresist mask between, over, and adjacent to said third opening;

patterning said first conductive layer in areas not masked by said photoresist mask, whereby a bottom electrode for said stack capacitor is formed;

forming a capacitor dielectric over said bottom electrode; and forming a top electrode over said capacitor dielectric.

2. The method of claim 1 wherein said first conductive layer is formed of doped polycrystalline silicon to a thickness of between about 2000 and 6000 Angstroms.

3. The method of claim 2 wherein said polycrystalline silicon is doped in-situ.

4. The method of claim 2 wherein said polycrystalline silicon is doped by ion implantation of phosphorus 31P at a dose of between about 5 E 15 and 2 E 16 atoms/cm.$^2$ and at an energy of between about 20 and 60 KeV.

5. The method of claim 1 wherein said third opening is formed to a depth of between about 1000 and 5000 Angstroms.

6. The method of claim 1 wherein said forming silicon nitride spacers further comprises the steps of:

forming a layer of silicon nitride over said first insulating layer and in said second opening; and anisotropically etching said silicon nitride layer.

7. The method of claim 6 wherein said layer of silicon nitride is formed to a thickness of between about 600 and 2400 Angstroms, whereby said thickness determines the width of said third opening.

8. The method of claim 1 wherein said capacitor dielectric layer is formed to a thickness of between about 30 and 90 Angstroms.

9. The method of claim 1 wherein said forming a capacitor dielectric layer further comprises the steps of:

forming a first layer of silicon oxide over said bottom electrode;

forming an intermediate layer of silicon nitride over said first layer of silicon oxide; and forming a second layer of silicon oxide over said intermediate layer of silicon nitride, whereby said capacitor dielectric layer has an ONO (oxide-nitride-oxide) structure.

10. The method of claim 1 wherein said top electrode is formed of doped polycrystalline silicon at a thickness of between about 1000 and 3000 Angstroms.

11. A method of forming a DRAM (Dynamic Random Access Memory) cell having a stack capacitor, comprising the steps of:

providing a MOS (metal oxide semiconductor) device having first and second active regions, adjacent to a field oxide region on which there is a conductive word line, in a silicon substrate;

forming a first insulating layer over said MOS device, said conductive word line, and said field oxide region;

patterning said first insulating layer to form a cell contact opening to one of said first and second active regions;

forming a first conductive layer over said first insulating layer and in said opening;

forming a second insulating layer over said first conductive layer;

patterning said second insulating layer to form a second opening centered over said cell contact opening, said second opening having vertical surfaces and a portion of said first conductive layer therein;

forming silicon nitride spacers on the vertical surfaces of said second opening;

oxidizing said first conductive layer within said second opening, whereby an oxide mask is formed;

removing said silicon nitride spacers;

forming a third opening in said first conductive layer, in areas not masked by said oxide mask;

removing said oxide mask and said second insulating layer;

forming a photoresist mask between, over, and adjacent to said third opening;

patterning said first conductive layer in areas not masked by said photoresist mask, whereby a bottom electrode for said stack capacitor is formed;

forming a capacitor dielectric over said bottom electrode;

forming a top electrode over said capacitor dielectric, while leaving an exposed portion of said first insulating layer;

forming a third insulating layer over said top electrode over exposed portion of said first insulating layer;

forming a bit line contact opening through said first and third insulating layers to said second active region; and forming a third conductive layer over said third insulating layer and in said bit line contact opening.

12. The method of claim 11 wherein said first conductive layer is formed of doped polycrystalline silicon to a thickness of between about 2000 and 6000 Angstroms.

13. The method of claim 12 wherein said polycrystalline silicon is doped in-situ.

14. The method of claim 12 wherein said polycrystalline silicon is doped by ion implantation of phosphorus 31P at a dose of between about 5 E 15 and 2 E 16 atoms/cm.$^2$ and at an energy of between about 20 and 60 KeV.

15. The method of claim 11 wherein said third opening is formed to a depth of between about 1000 and 5000 Angstroms.

16. The method of claim 11 wherein said forming silicon nitride spacers further comprises the steps of:

forming a layer of silicon nitride over said first insulating layer and in said second opening; and anisotropically etching said silicon nitride layer.

17. The method of claim 16 wherein said layer of silicon nitride is formed to a thickness of between about 600 and 2400 Angstroms, whereby said thickness determines the width of said third opening.

18. The method of claim 11 wherein said capacitor dielectric layer is formed to a thickness of between about 30 and 90 Angstroms.

19. The method of claim 11 wherein said forming a capacitor dielectric layer further comprises the steps of:
  forming a first layer of silicon oxide over said bottom electrode;
  forming an intermediate layer of silicon nitride over said first layer of silicon oxide; and
  forming a second layer of silicon oxide over said intermediate layer of silicon nitride,
  whereby said capacitor dielectric layer has an ONO (oxide-nitride-oxide) structure.

20. The method of claim 11 wherein said top electrode is formed of doped polycrystalline silicon at a thickness of between about 1000 and 3000 Angstroms.

* * * * *